United States Patent
Chen et al.

(10) Patent No.: US 9,508,446 B1
(45) Date of Patent: Nov. 29, 2016

(54) TEMPERATURE COMPENSATED REVERSE CURRENT FOR MEMORY

(71) Applicant: MACRONIX INTERNATIONAL CO., LTD., Hsinchu (TW)

(72) Inventors: Chung-Kuang Chen, Hsinchu (TW); Yi-Ting Lai, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 14/749,460

(22) Filed: Jun. 24, 2015

(51) Int. Cl.
*G11C 16/04* (2006.01)
*G11C 16/28* (2006.01)
*G11C 7/04* (2006.01)
*G11C 7/12* (2006.01)

(52) U.S. Cl.
CPC .......... *G11C 16/28* (2013.01); *G11C 7/04* (2013.01); *G11C 16/0483* (2013.01); *G11C 7/12* (2013.01)

(58) Field of Classification Search
CPC ....... G11C 7/04; G11C 16/0483; G11C 7/12; G11C 2213/71; G11C 13/0026; G11C 16/10; G11C 16/24
USPC ............... 365/185.17–185.18, 211, 189.05
See application file for complete search history.

(56) References Cited

U.S. PATENT DOCUMENTS

| | | |
|---|---|---|
| 6,906,940 B1 | 6/2005 | Lue |
| 7,315,474 B2 | 1/2008 | Lue |
| 7,420,242 B2 | 9/2008 | Lung |
| 7,489,556 B2 * | 2/2009 | Tanzawa ............. G11C 7/04 365/185.23 |
| 7,688,635 B2 * | 3/2010 | Tang ............... G11C 16/0483 365/185.03 |
| 7,696,559 B2 | 4/2010 | Arai et al. |
| 7,851,849 B2 | 12/2010 | Kiyotoshi |
| 8,363,443 B2 * | 1/2013 | Chevallier ............ G11O 5/02 365/130 |
| 8,363,476 B2 | 1/2013 | Lue et al. |
| 8,467,219 B2 | 6/2013 | Lue |
| 8,503,213 B2 | 8/2013 | Chen et al. |
| 8,724,390 B2 | 5/2014 | Hung et al. |
| 8,724,394 B2 * | 5/2014 | Choe ................ G11C 16/0483 365/185.2 |
| 8,759,899 B1 | 6/2014 | Lue et al. |
| 9,245,642 B1 * | 1/2016 | Chen ................ G11C 16/3427 |
| 2005/0280061 A1 | 12/2005 | Lee |
| 2007/0045708 A1 | 3/2007 | Lung |
| 2007/0252201 A1 | 11/2007 | Kito et al. |

(Continued)

FOREIGN PATENT DOCUMENTS

EP 2048709 A2 4/2009

OTHER PUBLICATIONS

Chen et al., "A Highly Pitch Scalable 3D Vertical Gate (VG) NAND Flash Decoded by a Novel Self-Aligned Independently Controlled Double Gate (IDG) String Select Transistor (SSL)," 2012 Symp. on VLSI Technology (VLSIT), Jun. 12-14, 2012, p. 91-92.

(Continued)

*Primary Examiner* — David Lam
(74) *Attorney, Agent, or Firm* — Haynes Beffel & Wolfeld LLP

(57) ABSTRACT

One aspect of the technology is a memory device comprising a memory array, a sense circuit, and temperature compensated bias circuitry. The memory array is electrically coupled between a bit line bias circuit and a common source line. The bit line bias circuit generates a temperature compensated sense current through the memory array. The temperature compensated bias circuitry controls the bit line bias circuit to generate the temperature compensated sense current through the memory array.

18 Claims, 9 Drawing Sheets

(56) References Cited

U.S. PATENT DOCUMENTS

| | | |
|---|---|---|
| 2008/0073635 A1 | 3/2008 | Kiyotoshi et al. |
| 2008/0175032 A1 | 7/2008 | Tanaka et al. |
| 2008/0180994 A1 | 7/2008 | Katsumata et al. |
| 2009/0097321 A1 | 4/2009 | Kim et al. |
| 2009/0184360 A1 | 7/2009 | Jin et al. |
| 2010/0270593 A1 | 10/2010 | Lung et al. |
| 2012/0119283 A1 | 5/2012 | Lee et al. |
| 2012/0182806 A1 | 7/2012 | Chen et al. |

OTHER PUBLICATIONS

Choi et al., "Performance Breakthrough in NOR Flash Memory With Dopant-Segregated Schottky-Barrier (DSSB) SONOS Devices," 2009 Symp. on VLSI Technology Jun. 16-18, 2009, Digest of Technical Papers, pp. 222-223.

Fukuzumi et al. "Optimal Integration and Characteristics of Vertical Array Devices for Ultra-High Density, Bit-Cost Scalable Flash Memory," IEEE Dec. 10-12, 2007, pp. 449-452.

Hsu et al., "Study of Sub-30nm Thin Film Transistor (TFT) Charge-Trapping (CT) Devices for 3D NAND Flash Application," 2009 IEEE, Dec. 7-9, 2009, pp. 27.4.1-27.4.4.

Hubert et al., "A Stacked SONOS Technology, Up to 4 Levels and 6nm Crystalline Nanowires, With Gate-All-Around or Independent Gates (Flash), Suitable for Full 3D Integration," IEEE 2009, Dec. 7-9, 2009, pp. 27.6.1-27.6.4.

Hung et al., "A highly scalable vertical gate (VG) 3D NAND Flash with robust program disturb immunity using a novel PN diode decoding structure," 2011 Symp. on VLSI Technology (VLSIT), Jun. 14-16, 2011, pp. 68-69.

Jang et al., "Vertical Cell Array Using TCAT (Terabit Cell Array Transistor) Technology for Ultra High Density NAND Flash Memory," 2009 Symposium on VLSI Technology Digest of Technical Papers, Jun. 16-18, 2009, pp. 192-193.

Jung et al., "Three Dimensionally Stacked NAND Flash Memory Technology Using Stacking Single Crystal Si Layers on ILD and TANOS Structure for Beyond 30nm Node," IEEE IEDM 2006, Dec. 11-13, 4 pages.

Katsumata, et al., "Pipe-shaped BiCS Flash Memory With 16 Stacked Layers and Multi-Level-Cell Operation for Ultra High Density Storage Devices," 2009 Symposium on VLSI Technology Digest of Technical Papers, Jun. 16-18, 2009, pp. 136-137.

Kim et al. "Novel Vertical-Stacked-Array-Transistor (VSAT) for Ultra-High-Density and Cost-Effective NAND Flash Memory Devices and SSD (Solid State Drive)", Jun. 2009 Symposium on VLSI Technology Digest of Technical Japers, pp. 186-187.

Kim et al., "Multi-Layered Vertical Gate NAND Flash Overcoming Stacking Limit for Terabit Density Storage," 2009 Symposium on VLSI Technology Digest of Technical Papers, Jun. 16-18, 2009, pp. 188-189.

Kim et al., "Novel 3-D Structure for Ultra High Density Flash Memory with VRAT (Vertical-Recess-Array-Transistor) and PIPE (Planarized Integration on the same PlanE)," IEEE 2008 Symposium on VLSI Technology Digest of Technical Papers, Jun. 17-19, 2008, pp. 122-123.

Kim et al., "Three-Dimensional Nand Flash Architecture Design Based on Single-Crystalline Stacked Array," Electron Devices, IEEE Transactions on, vol. 59, No. 1, pp. 35, 45, Jan. 2012.

Lai et al., "A Multi-Layer Stackable Thin-Film Transistor (TFT) NAND-Type Flash Memory," Electron Devices Meeting, 2006, IEDM '06 International, Dec. 11-13, 2006, pp. 1-4.

Lue et al., "A Highly Scalable 8-Layer 3D Vertical-Gate (VG) TFT NAND Flash Using Junction-Free Buried Channel BE-SONOS Device", 2010 Symposium on VLSI Technology Digest of Technical Papers, pp. 131-132, Jun. 15-17, 2010.

Nowak et al., "Intrinsic fluctuations in Vertical NAND flash memories," 2012 Symposium on VLSI Technology, Digest of Technical Papers, pp. 21-22, Jun. 12-14, 2012.

Tanaka, H., et al., "Bit Cost Scalable Technology with Punch and Plug Process for Ultra High Density Flash Memory," IEEE Symposium on VLSI Technology, Jun. 12-14, 2007, 2 pages.

Wang, Michael "Technology Trends on 3D-NAND Flash Storage", Impact 2011, Taipei, dated Oct. 20, 2011, found at 222.impact.org.tw/2011/files/newsfile/201111110190.pdf.

\* cited by examiner

TEMPERATURE COMPENSATED REVERSE CURRENT FOR MEMORY

BACKGROUND OF THE INVENTION

When reading the contents of a nonvolatile memory array, forward sensing is performed using a sense current that typically flows in a direction from the sense node in the page buffer, through the memory array, and to a common source line at a ground voltage. In traditional temperature compensation that aims to maintain a steady sense current throughout a temperature range, temperature compensation is performed to vary a word line voltage of the word line accessing the selected memory cell in a read or verify operation.

However, such traditional temperature compensation is not ideal for a 3D memory array such as a 3D vertical gate memory array. In a 3D vertical gate memory array, the same word line accesses different layers in the 3D memory array. Accordingly, a temperature compensated word line voltage which generates a temperature independent sense current in one layer of the 3D memory array may generate a temperature dependent sense current in other layers of the 3D memory array.

Even in a 2D memory array instead of a 3D memory array, traditional temperature compensation lacks a mechanism for adjusting the word line voltage in the event that characteristics of the memory cells change. Without such a mechanism, a change in characteristics of memory cells will not be accompanied by an adjustment in temperature compensation of the sense current.

Accordingly, it would be desirable for the temperature compensated sense current to be generated in a way that varies across different layers in a 3D memory array, and that varies with changes in the memory cell characteristics.

BRIEF SUMMARY OF THE INVENTION

A reverse sense current is generated that flows in a direction from a common source line at a reference voltage, through the memory array, and to the sense node in a sense circuit/page buffer. The bit line voltage of the memory array is varied via a bit line bias circuit in the page buffer. Because the bit line bias circuit can generate different bit line voltages for different layers of the memory array, different temperature compensation can be performed for different layers of the memory array. Also, the bit line bias circuit is controlled by a temperature compensated bias circuit that includes a reference memory array. Because changes such as temperature affect the reference memory array as well as the main memory array, changes in the memory cell characteristics such as temperature are incorporated when generating the temperature compensation.

One aspect of the technology is a memory device comprising a memory array, a sense circuit, and temperature compensated bias circuitry. The memory array is electrically coupled between a bit line bias circuit and a reference voltage line. The sense circuit includes a sense node and the bit line bias circuit generating a temperature compensated sense current through the memory array. The temperature compensated bias circuitry controls the bit line bias circuit to generate the temperature compensated sense current through the memory array.

One embodiment of the technology further comprises a reference array. The reference array is electrically coupled to the temperature compensated bias circuitry. The reference array includes reference memory cells representative of memory cells in the memory array. The temperature compensated bias circuitry controls the bit line bias circuit to generate the temperature compensated sense current through the memory array, based on electrical characteristics of the reference memory array.

One embodiment of the technology further comprises control circuitry applying a bias arrangement to the memory array to perform reverse current sensing with the memory array.

One embodiment of the technology further comprises control circuitry causing, at least during sensing with the sense circuit, the reference voltage line to have a greater voltage than the bit line bias circuit.

In one embodiment of the technology, the memory array includes a NAND string having a first end electrically coupled to the reference voltage line and second end electrically coupled to the bit line bias circuit.

In one embodiment of the technology, the bit line bias circuit includes a p-type transistor having a source terminal, a drain terminal, and a gate terminal, the gate terminal electrically coupled to the temperature compensated bias circuitry, the source terminal coupled closer than the drain terminal to the memory array.

Another aspect of the technology is a 3D memory device comprising a 3D memory array and a bit line bias circuit. The 3D memory array includes a plurality of layers of memory cells. The 3D memory array is electrically coupled between (i) a sense circuit including a sense node and a bit line bias circuit and (ii) a reference circuit electrically coupling a reference voltage to all layers of the plurality of layers of memory cells. The bit line bias circuit provides the 3D memory array with a plurality of bit line voltages. Different bit line voltages in the plurality of bit line voltages have values appropriate for generating sense current in different layers of the plurality of layers of memory cells.

One embodiment of the technology further comprises temperature compensated bias circuitry controlling the bit line bias circuit to generate, with temperature compensation, the different bit line voltages of the plurality of bit line voltages.

In one embodiment of the technology, the temperature compensation results in the sense current through the 3D memory array that is temperature independent.

In one embodiment of the technology, the different bit line voltages vary with the plurality of layers.

One embodiment of the technology further comprises a reference array including a plurality of second layers of reference cells. The temperature compensation that varies with the plurality of layers, is based on at least electrical characteristics of the reference array that vary with the plurality of second layers.

One embodiment of the technology further comprises control circuitry applying a bias arrangement to the 3D memory array to performing reverse current sensing with the 3D memory array.

One embodiment of the technology further comprises control circuitry causing, at least during sensing, the reference voltage line to have a greater voltage than the different bit line voltages of the plurality of bit line voltages.

In one embodiment of the technology, the 3D memory array is a vertical gate memory array with the plurality of layers of memory cells.

In one embodiment of the technology, the 3D memory array includes a plurality of NAND strings having first ends electrically coupled to the reference voltage line and second ends electrically coupled to the bit line bias circuit.

In one embodiment of the technology, the bit line bias circuit includes a p-type transistor having a source terminal, a drain terminal, and a gate terminal, the gate terminal electrically coupled to the temperature compensated bias circuitry, the source terminal coupled closer than the drain terminal to the 3D memory array.

Another aspect of the technology is a method, comprising:

generating a sense current through a memory array to sense data stored on the memory array, the sense current flowing from a reference line having a first voltage through the memory array towards a sense node having a second voltage lower than the first voltage, wherein the reverse current is compensated for temperature.

In one embodiment of the technology, the reverse current is compensated for temperature such that the sense current is temperature independent.

Another aspect of the technology is a method, comprising:

generating a plurality of bit line voltages appropriate for generating sense current in different layers of a plurality of layers of memory cells in a 3D memory array, the 3D memory array electrically coupled between (i) a sense circuit including a sense node and a bit line bias circuit and (ii) a reference circuit electrically coupling a reference voltage to all layers of the plurality of layers of memory cells.

In one embodiment of the technology, the plurality of bit line voltages are temperature compensated to generate a temperature independent sense current through the 3D memory array.

Other features, aspects and advantages of the present invention can be seen on review the figures, the detailed description, and the claims which follow.

DETAILED DESCRIPTION OF THE INVENTION

Figure 1:
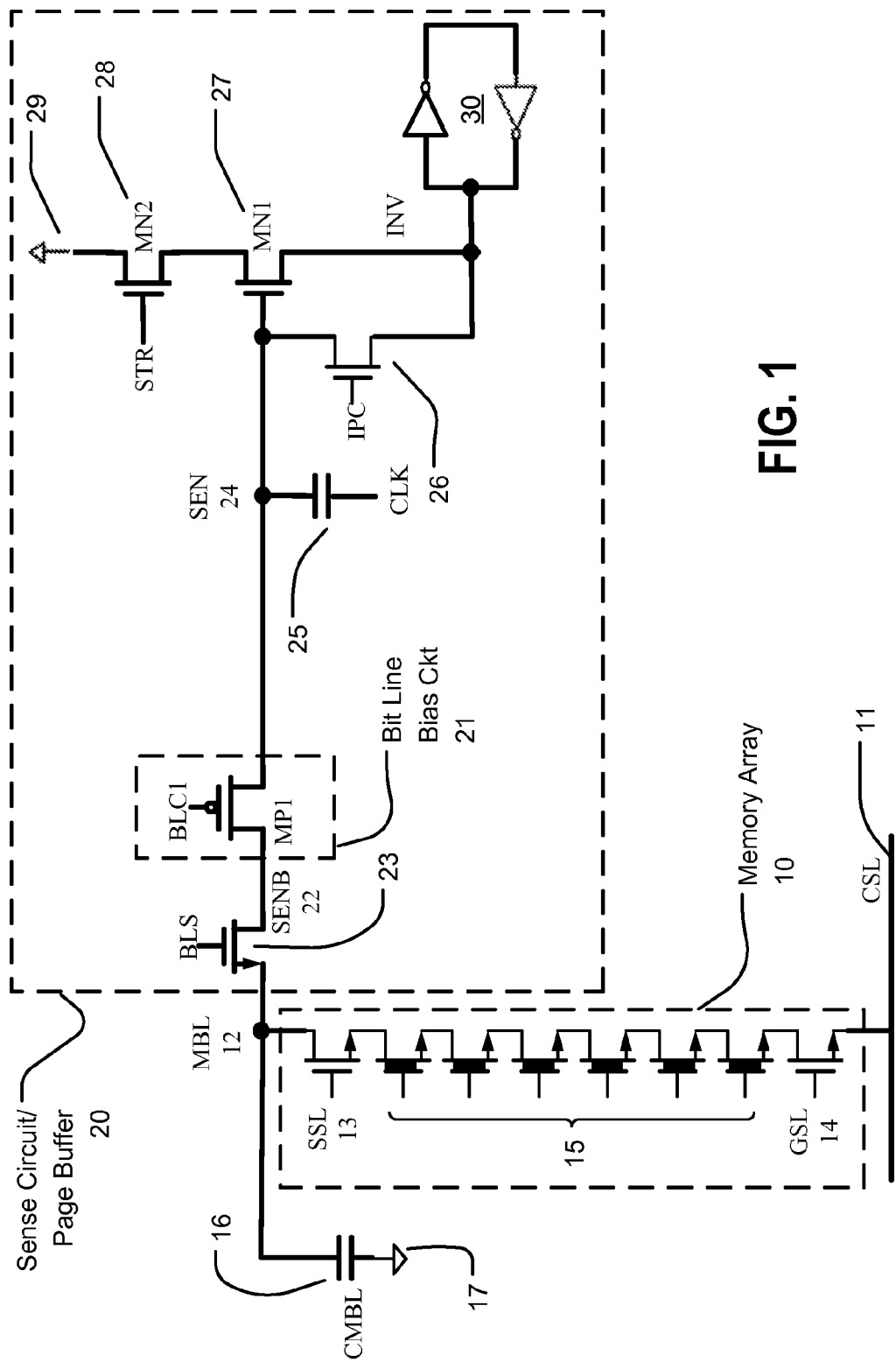
FIG. 1 is a simplified circuit diagram with a sample page buffer/sense circuit which performs current sensing with temperature compensated sense current on a sample memory array.

The following description will typically be with reference to specific structural embodiments and methods. It is to be understood that there is no intention to limit the invention to the specifically disclosed embodiments and methods but that the invention may be practiced using other features, elements, methods and embodiments. Preferred embodiments are described to illustrate the present invention, not to limit its scope, which is defined by the claims. Those of ordinary skill in the art will recognize a variety of equivalent variations on the description that follows. Like elements in various embodiments are commonly referred to with like reference numerals.

FIG. 1 is a simplified circuit diagram with a sample page buffer/sense circuit which performs current sensing with temperature compensated sense current on a sample memory array.

Sense circuit/page buffer 20 causes reverse sense current to flow from common source line CSL 11 through memory array 10 and then to sense circuit/page buffer 20. The sense current is caused by the voltage difference between CSL 11 and node MBL (main bit line) 12. The voltage of node MBL 12 is determined by bit line bias circuit 21. Bit line bias circuit 21 includes a p-type transistor MP1 with gate bias BLC1. Gate bias BLC1 is generated by a temperature compensated bias circuit with various embodiments discussed herein. P-type transistor MP1 also has a drain coupled to sense node SEN 24 and a source coupled to node SENB 22. N-type transistor 23 has a source coupled to node SENB 22 and a drain coupled to node MBL 12. Node SEN 24 is coupled via capacitance 25 to signal CLK (clock). N-type transistors MN2 28 and MN1 27 are coupled in series between node 29 and node INV of bit storage 30. Node 29 is used to exchange data between the sense circuit/page buffer 20 and other memory circuitry. N-type transistor MN2 28 has a gate receiving signal STR (strobe). N-type transistor MN1 27 has a gate coupled to node SEN 24. N-type transistor 26 is coupled between node SEN 24 and node INV, and has a gate receiving signal IPC. The memory array includes a NAND string of memory transistors 15 connected in series between a first access transistor controlled by a string select line SSL signal 13 and a second access transistor controlled by a ground select line GSL signal 14. Metal bit line parasitic capacitance is represented by CMBL 16.

Figure 2:
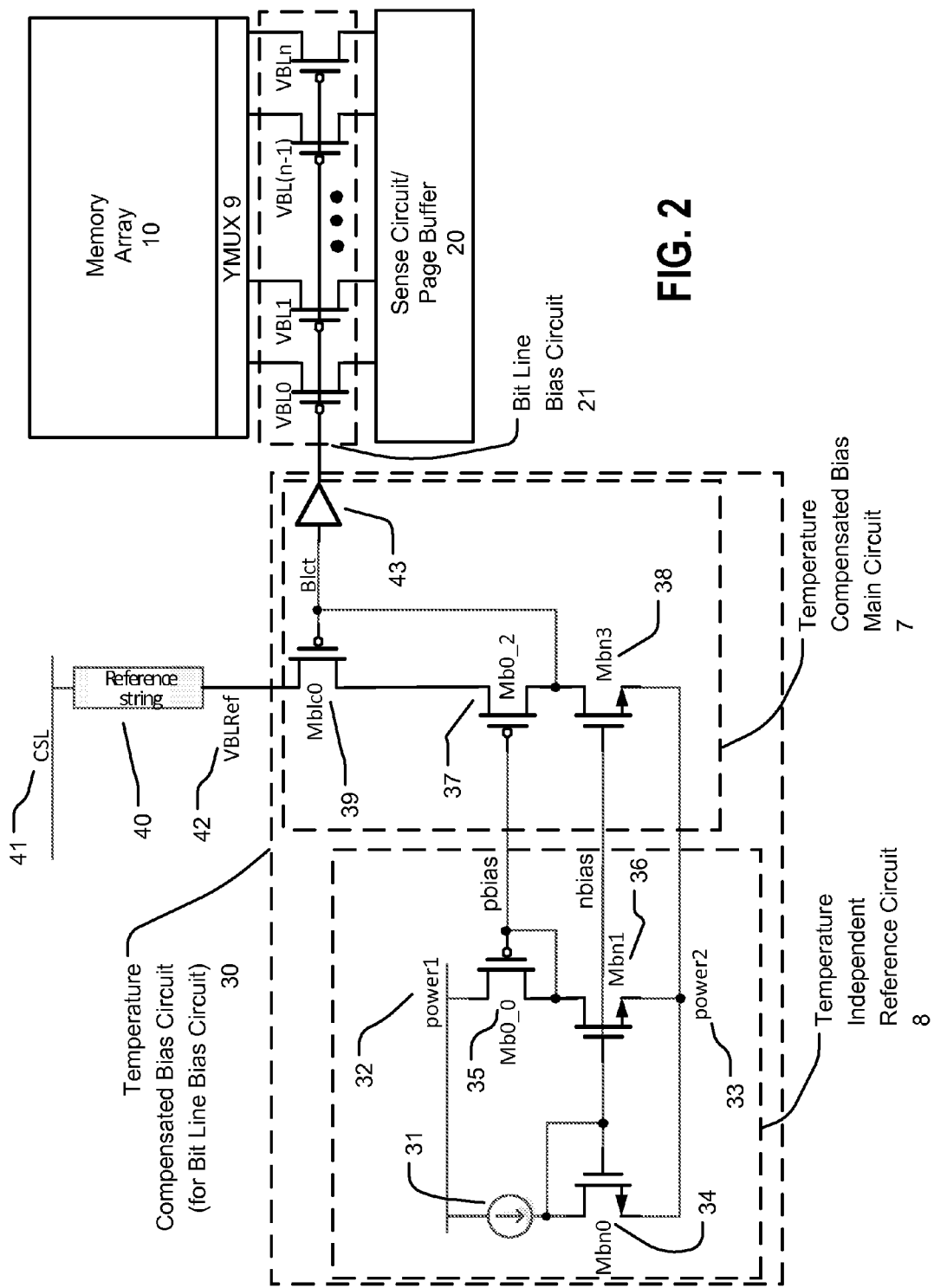
FIG. 2 is a simplified circuit diagram of a temperature compensated bias circuit which generates the bias to generate a temperature compensated sense current in page buffer/sense circuit such as the one shown in more detail in FIG. 1.

FIG. 2 is a simplified circuit diagram of a temperature compensated bias circuit which generates the bias to generate a temperature compensated sense current in page buffer/sense circuit such as the one shown in more detail in FIG. 1.

Bit line bias circuit 21 includes multiple p-type transistors VBL0, VBL1, . . . , VBL(n−1), and VBLn that each respectively control the bit line bias for a respective part of the memory array 10, such as a NAND string, accessed via YMUX 9. The multiple p-type transistors VBL0, VBL1, . . . , VBL(n−1), and VBLn are each coupled to a respective sense circuit/page buffer 20. Alternatively, multiple ones of the p-type transistors VBL0, VBL1, ..., VBL(n−1), and VBLn share at least one instance of the sense circuit/page buffer 20.

The gate bias for the bit line bias circuit 21 is generated by temperature compensated bias circuit 30, which includes temperature independent reference circuit 8 and temperature compensated bias main circuit 7. Temperature independent reference circuit 8 includes a high voltage reference power1 32 and a low voltage reference power2 33. Current source 31 has a first terminal coupled to power1 32 and a second terminal coupled to diode-connected (coupling together drain and gate) n-type transistor Mbn0 34. Diode-connected n-type transistor Mbn0 34 has a first terminal coupled to current source 31 and a second terminal coupled to power2 33. Diode-connected (coupling together drain and gate) p-type transistor Mb0_0 35 is coupled in series with n-type transistor Mbn1 36 between power1 32 and power2 33. Diode-connected p-type transistor Mb0_0 35 has a first terminal coupled to power1 32 and a second terminal coupled to n-type transistor Mbn1 36. This second terminal is node pbias. N-type transistor Mbn1 36 has a drain coupled to node pbias, a source coupled to power2 33, and a gate coupled to the gate of n-type transistor Mbn0 34. This gate is node nbias.

Temperature compensated bias main circuit 7 includes p-type transistor Mblc0 39, p-type transistor Mb0_2 37, and n-type transistor Mbn3 38 coupled in series in between node VBLRef 42 and power2 33. N-type transistor Mbn3 38 has a gate coupled to node nbias. P-type transistor Mb0_2 37 has a gate coupled to node pbias. The node in between n-type transistor Mbn3 38 and p-type transistor Mb0_2 37 is coupled to the gate of p-type transistor Mblc0 39. The gate of p-type transistor Mblc0 39 is node Blct. Node Blct is amplified by amplifier 43 and output to the bit line bias circuit 21.

Reference string 40 is coupled between node VBLRef 42 and CSL 41. Reference string 40 includes devices that are the same or similar to memory cells in memory array 10, such that the electrical characteristics of reference string 40 have electrical characteristics representative of the electrical characteristics of memory cells in memory array 10.

Temperature independent reference circuit 8 receives a temperature independent current 31 and generates temperature dependent biases pbias and nbias. Temperature dependent biases pbias and nbias make a temperature independent reference current through reference string 40 and a reference voltage at node VBLRef 42. In turn, the p-type transistor Mblc0 39 generates from node VBLRef 42 a temperature compensated bit line bias Blct which is amplified by amplifier 43 to generate the gate bias for bit line bias circuit 21.

Figure 3:
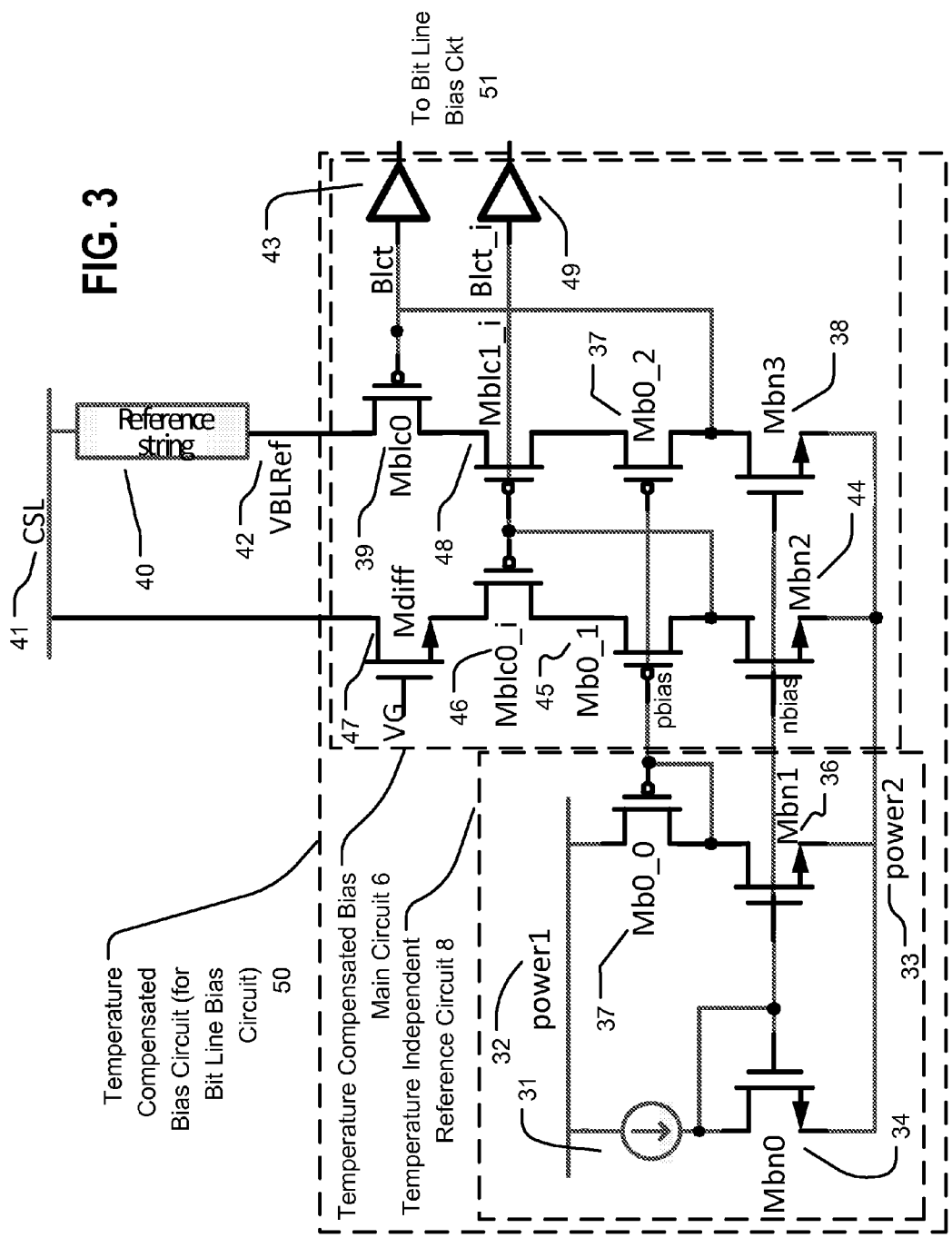
FIG. 3 is another simplified circuit diagram of a temperature compensated bias circuit in a cascode configuration.

FIG. 3 is another simplified circuit diagram of a temperature compensated bias circuit in a cascode configuration.

The gate biases for the bit line bias circuit 51 are generated by temperature compensated bias circuit 50, which includes temperature independent reference circuit 8 and temperature compensated bias main circuit 6.

Temperature independent reference circuit 8 in FIG. 3 can be the same as temperature independent reference circuit 8 in FIG. 2, and generates pbias and nbias for temperature compensated bias main circuit 6.

Temperature compensated bias main circuit 6 in FIG. 3 has similar parts compared with temperature compensated bias main circuit 7 in FIG. 2. However, between p-type transistor Mblc0 39 and p-type transistor Mb0_2 37, cascode p-type transistor Mblc1_i 48 is coupled in series. Also, an additional differential path adds n-type transistor Mdiff 47, p-type transistor Mblc0_i 46, p-type transistor Mb0_1 45, and n-type transistor Mbn2 44 coupled in series in between node CSL 41 and power2 33. N-type transistor Mdiff 47 has a gate receiving signal VG. VG is a bias to clamp a voltage bias for 44, 45, and 46. N-type transistor Mbn2 44 has a gate coupled to node nbias. P-type transistor Mb0_1 45 has a gate coupled to node pbias. The node in between p-type transistor Mb0_1 45 and n-type transistor Mbn2 44 is coupled to the gate of p-type transistor Mblc0_i 46 and the gate of p-type transistor Mblc1_i 46. The gate of p-type transistor Mblc0_i 46 and the gate of p-type transistor Mblc1_i 46 are node Blct_i. Node Blct_i is amplified by amplifier 49 and output to the bit line bias circuit 51.

Figure 4:
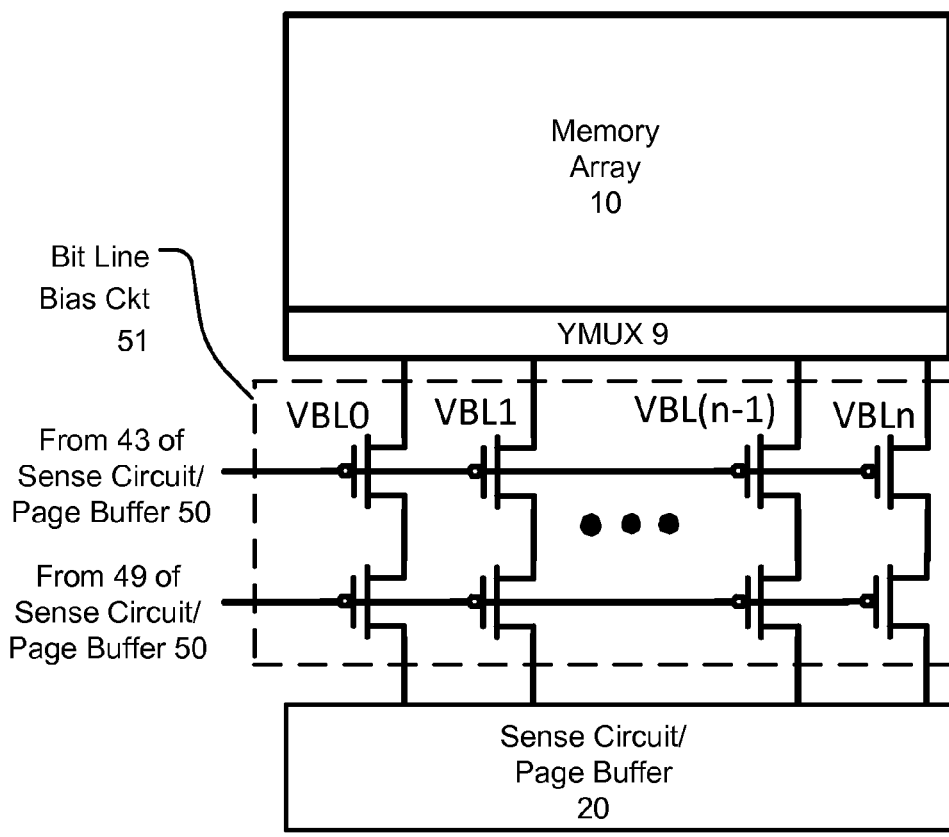
FIG. 4 is a simplified circuit diagram of a bit line bias circuit in between the page buffer/sense circuit and memory array, biased by the cascode temperature compensated bias circuit of FIG. 3.

FIG. 4 is a simplified circuit diagram of a bit line bias circuit in between the page buffer/sense circuit and memory array, biased by the cascode temperature compensated bias circuit 50 of FIG. 3.

Bit line bias circuit 51 in FIG. 4 is similar to bit line bias circuit 21 in FIG. 2. However, bit line bias circuit 51 receives an additional gate bias generated by amplifier 49 of temperature compensated bias circuit 50.

Bit line bias circuit 51, similar to bit line bias circuit 21 in FIG. 2, includes a first row of multiple p-type transistors VBL0, VBL1, ..., VBL(n−1), and VBLn that receive gate bias from amplifier 43. In addition, bit line bias circuit 51 includes a second row of multiple p-type transistors VBL0', VBL1', ..., VBL(n−1)', and VBLn' that receive gate bias from amplifier 49. The first and second rows of multiple p-type transistors VBL0, VBL1, ..., VBL(n−1), VBLn and VBL0', VBL1', ..., VBL(n−1)', VBLn' form a cascode configuration that controls the bit line bias for a respective part of the memory array 10, such as a NAND string, accessed via YMUX 9. As with FIG. 2, each pair of series p-type transistors VBL0, VBL1, ..., VBL(n−1), and VBLn is coupled to a respective sense circuit/page buffer 20. Alternatively, multiple pairs of the p-type transistors VBL0, VBL1, ..., VBL(n−1), and VBLn share at least one instance of the sense circuit/page buffer 20.

Figure 5:
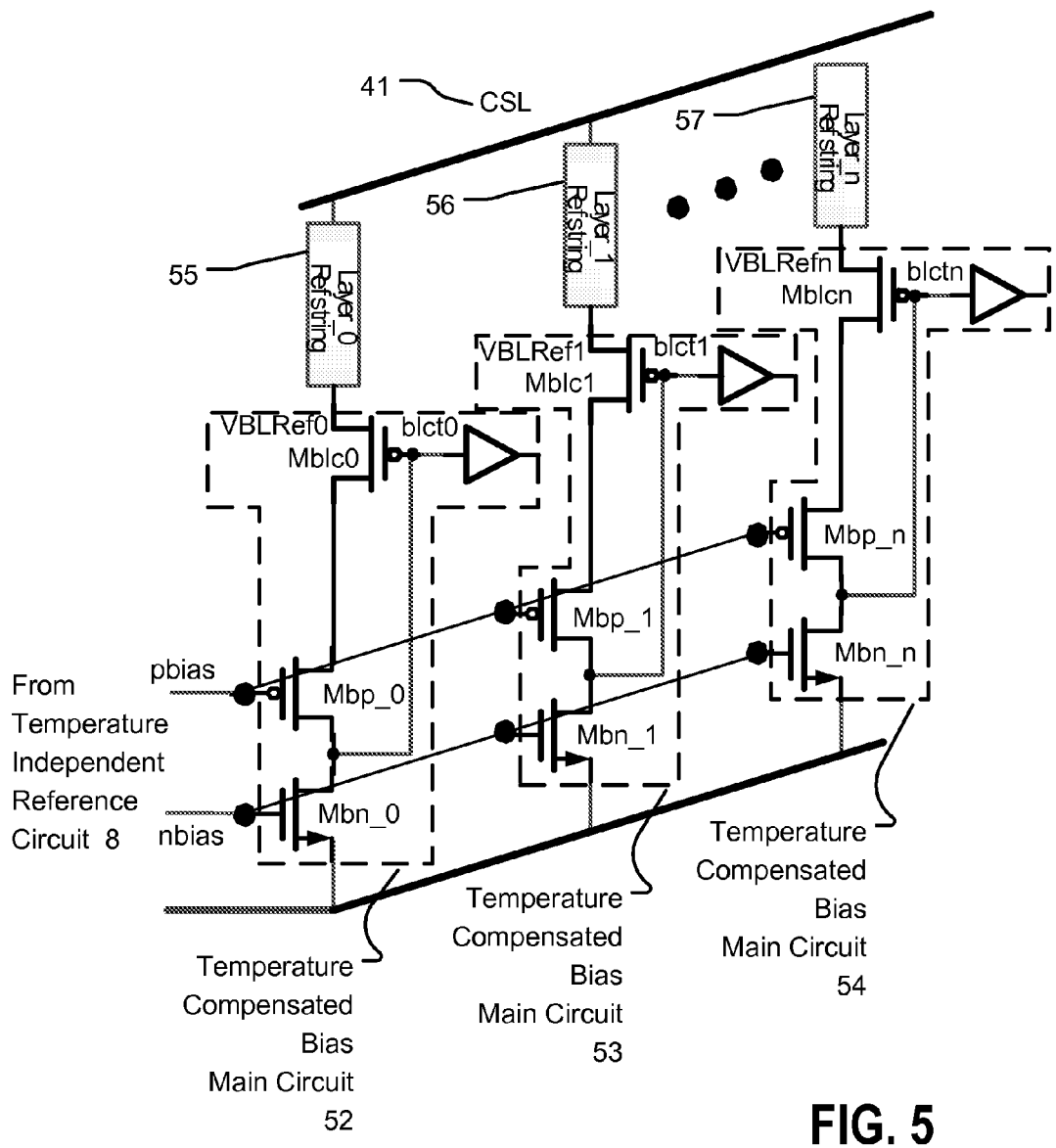
FIG. 5 is a simplified circuit diagram of a temperature compensated bias circuit which generates biases to generate the sense currents with varying temperature compensation in page buffers/sense circuits at different layers of a 3D memory array.

FIG. 5 is a simplified circuit diagram of a temperature compensated bias circuit which generates the biases to generate the sense currents with varying temperature compensation in page buffers/sense circuits at different layers of a 3D memory array.

The temperature compensated bias main circuits 52, 53, and 54 in FIG. 5 are each like the temperature compensated bias main circuit 7 in FIG. 2. Temperature compensated bias main circuit 7 in FIG. 2 includes p-type transistor Mblc0 39, p-type transistor Mb0_2 37, n-type transistor Mbn3 38, and amplifier 43 amplifying node Blct for output. This set of components corresponds to each of the following sets of temperature compensated bias main circuits for the different temperature compensated bias main circuits:

(i) temperature compensated bias main circuit 52 in FIG. 5 includes p-type transistor Mblc0, p-type transistor Mbp_0, n-type transistor Mbn_0, and an amplifier amplifying node blct0 for output of gate voltage for the bit line bias circuit for memory layer 0.

(ii) temperature compensated bias main circuit 53 in FIG. 5 includes p-type transistor Mblc1, p-type transistor Mbp_1, n-type transistor Mbn_1, and an amplifier amplifying node blct1 for output of gate voltage for the bit line bias circuit for memory layer 1.

(iii) temperature compensated bias main circuit 54 in FIG. 5 includes p-type transistor Mblcn, p-type transistor Mbp_N, n-type transistor Mbn_N, and an amplifier amplifying node blctn for output of gate voltage for the bit line bias circuit for memory layer n.

The temperature compensated bias main circuits 52, 53, and 54 are coupled to respective reference strings 55, 56, and 57 to generate the reference voltages at respective nodes VBLRef0, VBLRef1, and VBLRefn. The electrical characteristics of reference strings 55, 56, and 57 have electrical characteristics representative of the electrical characteristics of memory cells in corresponding layers of 3D memory array 10. For more accurate representation, each reference string, and the portion of the memory which supports the sense current resulting from the gate bias generated by the reference string, are positioned in the same layer. Given the temperature distribution is non-uniform in a 3D array, a reference 3D array having the same layer arrangement as the actual 3D memory array supporting the sense currents more accurately represents the temperature distribution of the actual 3D memory array supporting the sense currents.

In an alternative embodiment, the temperature compensated bias main circuits for different layers of a 3D memory array can have a cascode configuration like temperature compensated bias main circuit 6 in FIG. 3. In this alternative embodiment, the bit line bias circuits for different layers of a 3D memory array also have a cascode configuration like bit line bias circuit 51 in FIG. 4.

Figure 6:
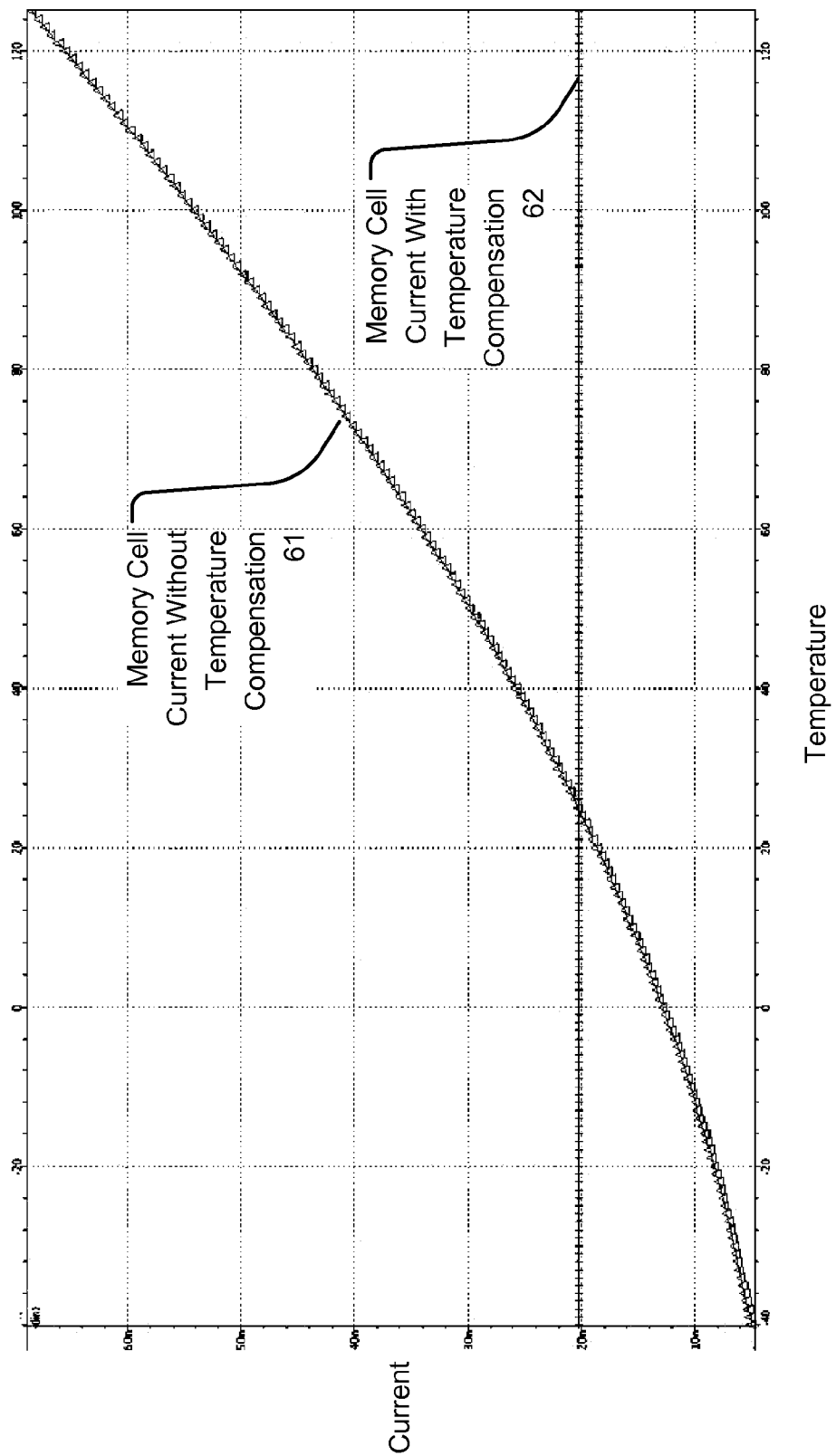
FIG. 6 is a graph of the sense currents with and without temperature compensation.

FIG. 6 is a graph of the sense currents with and without temperature compensation.

Trace 61 shows sense current changing substantially with temperature, for a memory array without temperature compensation. Trace 62 shows sense current through a memory array remaining constant with temperature, for a memory array with temperature compensated sense current as disclosed herein. The sense current remains constant over a wide temperature range between about −40 degrees Celsius and about 125 degrees Celsius.

Figure 7:
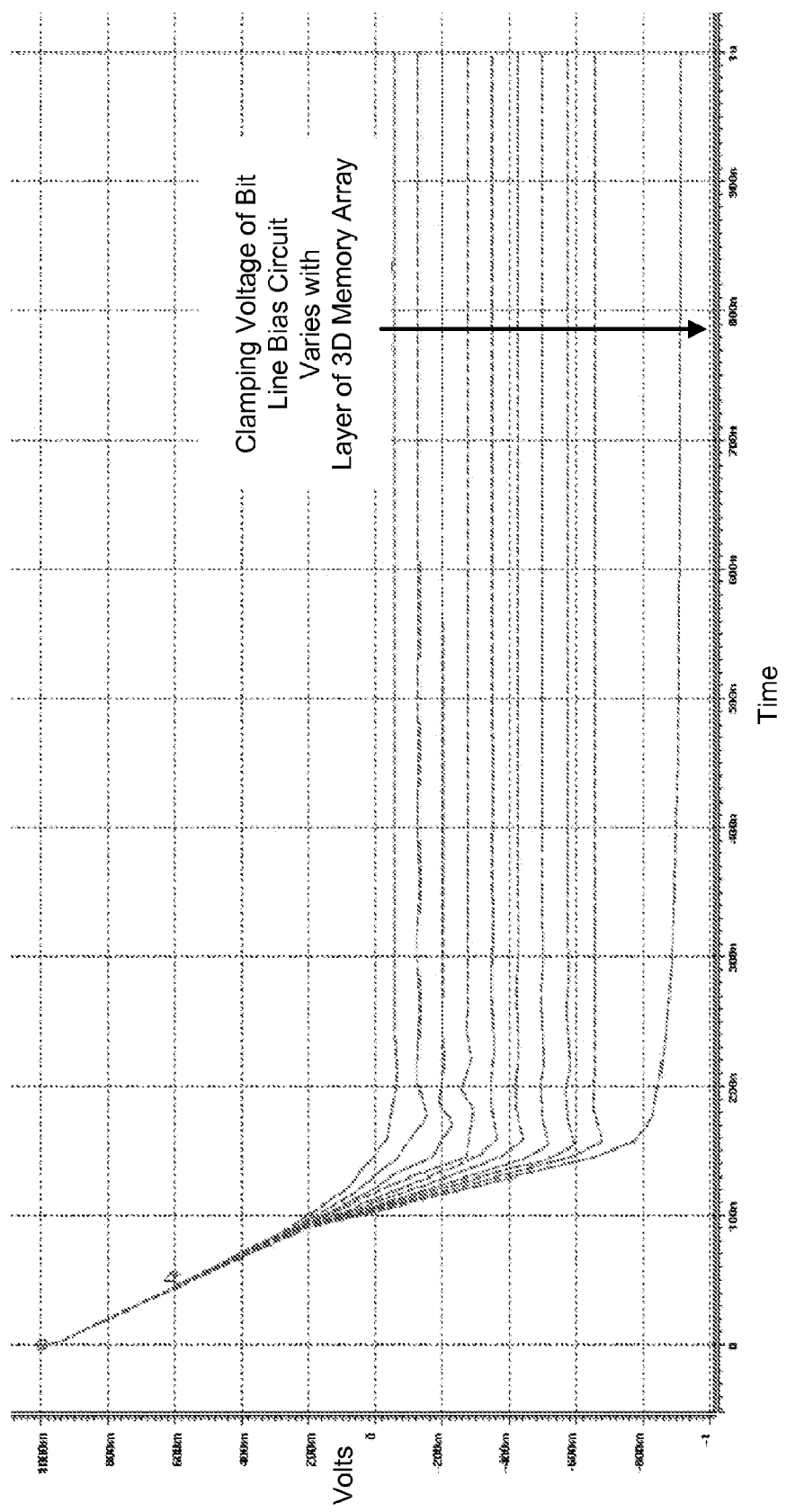
FIG. 7 is a graph of the clamping voltage of bit line bias circuits for page buffers/sense circuits for different layers of a 3D memory array.

FIG. 7 is a graph of the clamping voltage of bit line bias circuits for page buffers/sense circuits for different layers of a 3D memory array.

The temperature distribution is non-uniform across the different layers of a 3D memory layer. Accordingly, the temperature compensation to maintain a steady sense current is non-uniform across the different layers of a 3D memory layer. As a result, the clamping voltage of the bit line bias circuit varies across the different layers of a 3D memory layer.

Time=0 seconds is the beginning of a particular event. The clamping voltage can equals the gate voltage BLC1 in FIG. 1. Also, different layers can have different clamping bias Blct which compensates the Vth difference across different layers, and which demonstrates temperature compensation behavior.

Figure 8:
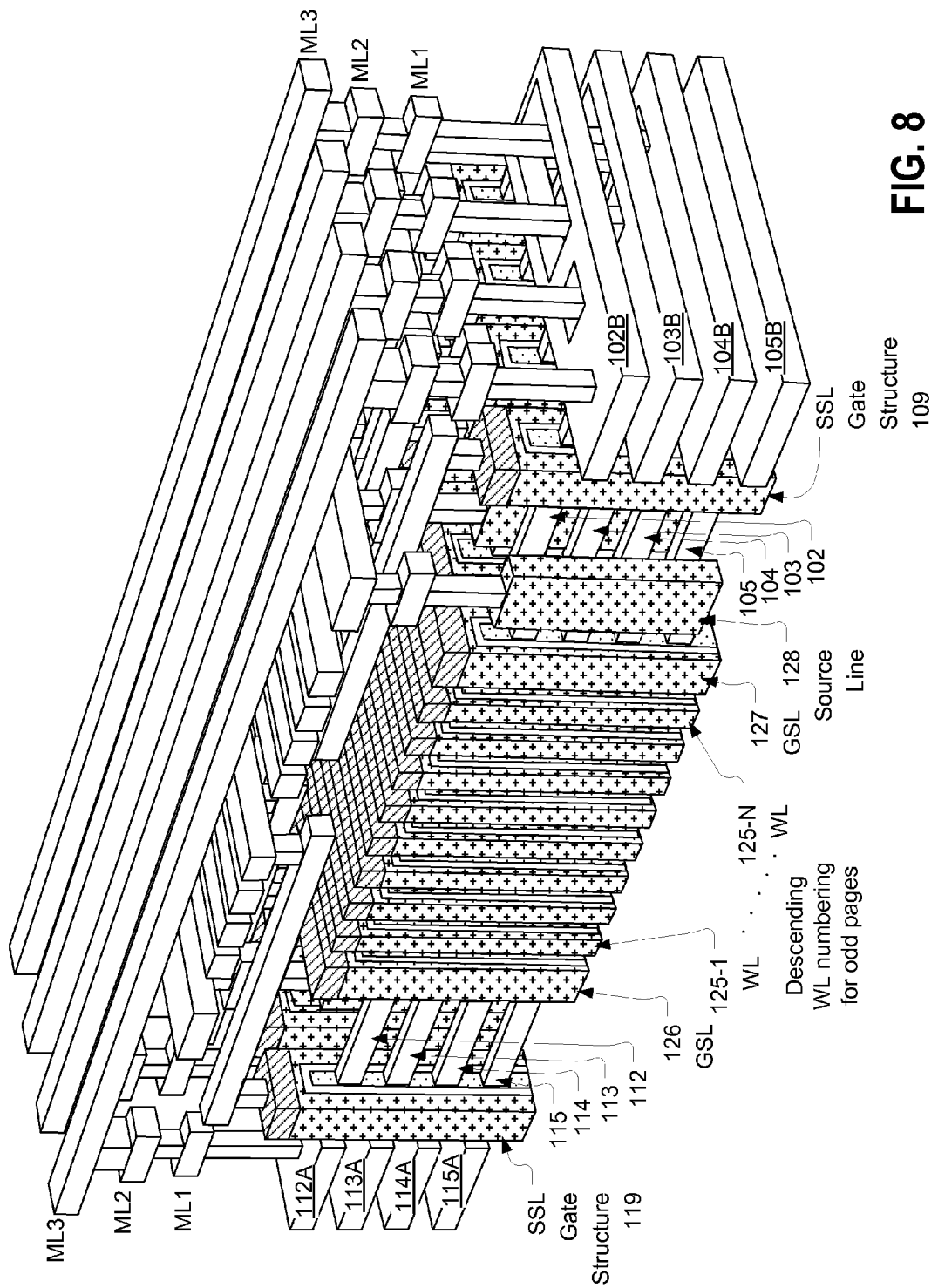
FIG. 8 is a sample block diagram of a 3D vertical gate NAND-flash memory 3D memory array, which is an example of the 3D memory array with memory cells which can be sensed with the sense currents that are generated as disclosed herein.

FIG. 8 is a sample perspective illustration of a 3D vertical gate NAND-flash memory 3D memory array, which is an example of the 3D memory array with memory cells which can be sensed with the sense currents that are generated as disclosed herein.

The device includes stacks of active lines in active layers of the array, alternating with insulating lines. Insulating material is removed from the drawing to expose additional structure. For example, insulating lines are removed from between the semiconductor lines in a same stack, and between the different stacks of semiconductor lines.

In the example, a multilayer array is formed on an insulating layer, and includes a plurality of word lines 125-1, . . . , 125-N conformal with the plurality of stacks. The plurality of stacks includes semiconductor lines 112, 113, 114, and 115 in multiple layers. Different layers of semiconductor lines support sense current with varying temperature compensation. Semiconductor lines in the same plane are electrically coupled together by bit line contact pads (e.g. 102B).

Bit line contact pads 112A, 113A, 114A, and 115A are on the near end of the figure and terminate semiconductor lines, such as semiconductor lines 112, 113, 114, and 115. As illustrated, these bit line contact pads 112A, 113A, 114A, and 115A are electrically connected by interlayer connectors to different bit lines in an overlying patterned metal layer, e.g. ML3, for connection to decoding circuitry to select planes within the array, via high voltage switching transistors. The different bit lines have biases determined by bit line bias circuitry as disclosed herein. These bit line contact pads 112A, 113A, 114A, and 115A can be formed over stepped substrate structures, and patterned at the same time that the plurality of stacks is defined.

Bit line contact pads 102B, 103B, 104B, and 105B on the far end of the figure terminate semiconductor lines, such as semiconductor lines 102, 103, 104, and 105. As illustrated, these bit line contact pads 102B, 103B, 104B, and 105B are electrically connected by interlayer connectors to different bit lines in an overlying patterned metal layer, e.g. ML3, for connection to decoding circuitry to select planes within the array, via high voltage switching transistors. These bit line contact pads 102B, 103B, 104B, and 105B can be formed over stepped substrate structures, and patterned at the same time that the plurality of stacks is defined.

In this example, any given stack of semiconductor lines is coupled to either the bit line contact pads 112A, 113A, 114A, and 115A, or the bit line contact pads 102B, 103B, 104B, and 105B, but not both. A stack of semiconductor bit lines has one of the two opposite orientations of bit line end-to-source line end orientation, or source line end-to-bit line end orientation. For example, the stack of semiconductor lines 112, 113, 114, and 115 has bit line end-to-source line end orientation; and the stack of semiconductor lines 102, 103, 104, and 105 has source line end-to-bit line end orientation.

The stack of semiconductor lines 112, 113, 114, and 115 terminated by the bit line contact pads 112A, 113A, 114A, and 115A, passes through SSL gate structure 119, ground select line GSL 126, word lines 125-1 WL through 125-N WL, ground select line GSL 127, and is terminated at the other end by source line 128. The stack of semiconductor lines 112, 113, 114, and 115 does not reach the bit line structures 102B, 103B, 104B, and 105B.

The stack of semiconductor lines 102, 103, 104, and 105 terminated by the bit line contact pads 102B, 103B, 104B, and 105B, passes through SSL gate structure 109, ground select line GSL 127, word lines 125-N WL through 125-1 WL, ground select line GSL 126, and is terminated at the other end by a source line (obscured by other parts of the figure). The stack of semiconductor lines 102, 103, 104, and 105 does not reach the bit line structures 112A, 113A, 114A, and 115A.

A layer of memory material is disposed in interface regions at cross-points between surfaces of the semiconductor lines 112-115 and 102-105 and the plurality of word lines 125-1 through 125-n. Ground select lines GSL 126 and GSL 127 are conformal with the plurality of stacks, similar to the word lines.

Every stack of semiconductor lines is terminated at one end by bit line contact pads and at the other end by a source line. For example, the stack of semiconductor lines 112, 113, 114, and 115 is terminated by bit line contact pads 112A, 113A, 114A, and 115A, and terminated on the other end by a source line 128.

Bit lines and string select lines are formed at the metal layers ML1, ML2, and ML3. Bit lines are coupled to a plane decoder (not shown) in the peripheral area on the circuit, via high voltage switching transistors. String select lines are coupled to a string select line decoder (not shown) in the peripheral area on the circuit.

The ground select lines GSL 126 and 127 can be patterned during the same step that the word lines 125-1 through 125-n are defined. Ground select devices are formed at cross-points between surfaces of the plurality of stacks and ground select lines GSL 126 and 127. The SSL gate structures 119 and 109 can be patterned during the same step that the word lines 125-1 through 125-n are defined. String select devices are formed at cross-points between surfaces of the plurality of stacks and string select (SSL) gate structures 119 and 109. These devices are coupled to decoding circuitry for selecting the strings within particular stacks in the array.

Figure 9:
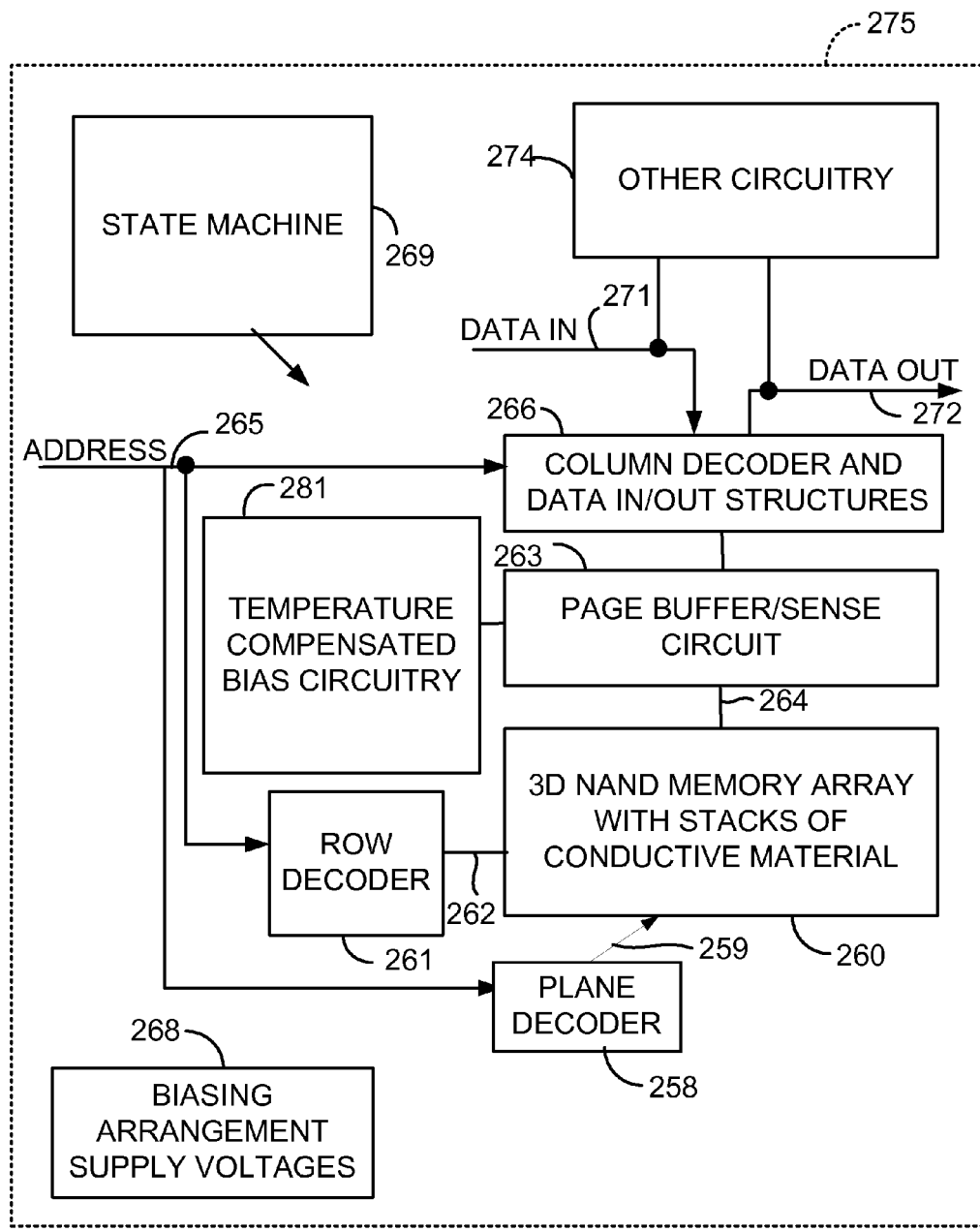
FIG. 9 is a simplified block diagram of an integrated circuit with temperature compensated bias circuitry as disclosed herein.

FIG. 9 is a simplified block diagram of an integrated circuit with temperature compensated bias circuitry as disclosed herein.

The integrated circuit line 275 includes a 3D NAND flash memory array 260, implemented as described herein, on a semiconductor substrate with stacks of conductive material and with capacitors with stacks of conductive material. A row decoder 261 is coupled to a plurality of word lines 262, and arranged along rows in the memory array 260. A column decoder in block 266 is coupled to a plurality of SSL lines 264 arranged along columns corresponding to stacks in the memory array 260 for reading and programming data from the memory cells in the array 260. A plane decoder 258 is coupled to a plurality of planes in the memory array 260 via bit lines 259. Addresses are supplied on bus 265 to column decoder 266, row decoder 261 and plane decoder 258. Page buffer/sense circuit 263 is coupled to the column decoder in block 266 and the array 260. Page buffer/sense circuit 263 has bit line bias circuitry which receives a temperature compensated bias from temperature compensated bias circuitry 281 as disclosed herein. Data is supplied via the data-in line 271 from input/output ports on the integrated circuit 275 or from other data sources internal or external to the integrated circuit 275, to the data-in structures in block 266. In the illustrated embodiment, other circuitry 274 is included on the integrated circuit, such as a general purpose processor or special purpose application circuitry, or a combination of modules providing system-on-a-chip functionality supported by the NAND flash memory cell array. Data is supplied via the data-out line 272 from the data out structures in block 266 to input/output ports on the integrated circuit 275, or to other data destinations internal or external to the integrated circuit 275.

A controller implemented in this example using bias arrangement state machine 269 controls the application of bias arrangement supply voltage generated or provided through the voltage supply or supplies in block 268, such as read, erase, program, erase verify and program verify voltages, and gate voltages to control the 1st and 2nd sets of vertical gate voltage switching transistors. The controller can be implemented using special-purpose logic circuitry as known in the art. In alternative embodiments, the controller comprises a general-purpose processor, which may be implemented on the same integrated circuit, which executes a computer program to control the operations of the device. In yet other embodiments, a combination of special-purpose logic circuitry and a general-purpose processor may be utilized for implementation of the controller.

In some embodiments, the routing can decoding are changed to alter the respective positions of the plane decoder, row decoder, and/or column decoder.

In another embodiment, a 2D array is used with decoding circuitry sufficient for a 2D array.

The above descriptions may have used terms such as above, below, top, bottom, over, under, et cetera. These terms may be used in the description and claims to aid understanding of the invention and not used in a limiting sense.

While the present invention is disclosed by reference to the preferred embodiments and examples detailed above, it is to be understood that these examples are intended in an illustrative rather than in a limiting sense. It is contemplated that modifications and combinations will occur to those skilled in the art, which modifications and combinations will be within the spirit of the invention and the scope of the following claims. Any and all patents, patent applications and printed publications referred to above are incorporated by reference.

The invention claimed is:

1. A memory device, comprising:
   a memory array including a bit line and a source line, memory cells in the array electrically coupled between the bit line and the source line;
   a source line bias circuit connected to the source line to apply a voltage higher than a voltage on the bit line in a read operation;
   a bit line bias circuit connected to the bit line, generating a temperature compensated sense current for the read operation on the bit line through a selected memory cell from the source line;
   temperature compensated bias circuitry which provides a temperature dependent voltage to the bit line bias circuit to offset variations in current on the bit line due to temperature; and
   a sense amplifier coupled to the bit line.

2. The memory device of claim 1, further comprising:
   a reference array electrically coupled to the temperature compensated bias circuitry, the reference array including reference memory cells representative of memory cells in the memory array,
   wherein the temperature compensated bias circuitry controls the bit line bias circuit to generate the temperature compensated sense current through the memory array, based on electrical characteristics of the reference memory array.

3. The memory device of claim 1, wherein the bit line bias circuit comprises a p-type transistor connected to the bit line and to the temperature dependent voltage, and wherein the voltage applied by the source line bias circuit in a read operation causes the bit line to have a greater voltage than the temperature dependent voltage of the bit line bias circuit.

4. The memory device of claim 1, wherein the memory array includes a NAND string having a first end electrically coupled to the source line and second end electrically coupled to the bit line.

5. The memory device of claim 1, wherein the bit line bias circuit includes a p-type transistor having a source terminal, a drain terminal, and a gate terminal, the gate terminal electrically coupled to the temperature compensated bias circuitry.

6. A 3D memory device, comprising:
   a 3D memory array including a plurality of layers of memory cells, the memory cells in the 3D memory array electrically coupled between (i) corresponding bit lines and (ii) a source line or corresponding source lines; and a bit line bias circuit is connected to the bit lines, and providing the 3D memory array with a plurality of different bit line voltages, the different bit line voltages being applied to bit lines in different parts of the memory array, the different bit line voltages in the plurality of bit line voltages having values controlled separately and that vary with different temperatures in different parts of the array.

7. The 3D memory device of claim 6, further comprising:
temperature compensated bias circuitry controlling the bit line bias circuit to generate, with temperature compensation, the different bit line voltages of the plurality of bit line voltages.

8. The 3D memory device of claim 7, wherein the different bit line voltages vary with the plurality of layers.

9. The 3D memory device of claim 7, further comprising:
a 3D reference array,
wherein the temperature compensation is based on at least electrical characteristics of the 3D reference array.

10. The 3D memory device of claim 7, wherein the bit line bias circuit includes a p-type transistor having a first source/drain terminal connected to the bit line, a second source/drain terminal in current flow communication with a page buffer, and a gate terminal, the gate terminal electrically coupled to the temperature compensated bias circuitry.

11. The 3D memory device of claim 6, further comprising:
control circuitry applying a bias arrangement to the 3D memory array to perform reverse current sensing with the 3D memory array.

12. The 3D memory device of claim 6, further comprising:
control circuitry causing, at least during sensing, the source line or source lines to have a greater voltage than the different bit line voltages of the plurality of bit line voltages.

13. The 3D memory device of claim 6, wherein the 3D memory array is a vertical gate memory array with the plurality of layers of memory cells.

14. The 3D memory device of claim 6, wherein the 3D memory array includes a plurality of NAND strings.

15. A memory device, comprising:
a 3D memory array including a plurality of bit lines and a source line, memory cells in the array electrically coupled between a corresponding bit line in the plurality of bit lines and the source line;
a page buffer coupled to the plurality of bit lines;
a source line bias circuit connected to the source line to apply a voltage higher than a voltage on the corresponding bit line of a selected memory cell in a read operation;
p-type transistors coupled in current flow communication between the bit lines in the plurality of bit lines and the page buffer; and
temperature compensated bias circuitry which provides temperature dependent voltages to gates of the p-type transistors to offset variations in current on the bit lines due to temperature.

16. The memory device of claim 15, including:
a plurality of reference cells disposed in different locations to track temperature in different parts of the 3D array;
wherein the temperature compensated bias circuitry includes circuits coupled to the reference cells to generate said temperature dependent voltages.

17. The memory device of claim 15, wherein the 3D memory array is a NAND array, the memory cells being disposed in NAND strings.

18. The memory device of claim 15, wherein the p-type transistors include series-connected sets of p-type transistors, having at least two members, between corresponding bit lines and the page buffer, and the temperature compensated bias circuitry provides temperature dependent voltages to gates of each of the p-type transistors in the series-connected sets.

* * * * *